United States Patent [19]

Sloane et al.

[11] Patent Number: 4,718,018

[45] Date of Patent: Jan. 5, 1988

[54] DIGITAL METHOD FOR SYNTHESIZING COMPOSITE VIDEO SIGNALS

[75] Inventors: Edwin A. Sloane, Los Altos; Kai Y. Chan, Milpitas; David D. Yau, San Jose, all of Calif.

[73] Assignee: Fairchild Semiconductor Corporation, Cupertino, Calif.

[21] Appl. No.: 800,472

[22] Filed: Nov. 21, 1985

[51] Int. Cl.[4] .......................... G06F 15/20; H04N 17/00
[52] U.S. Cl. ...................................... 364/480; 358/10; 358/139; 364/579
[58] Field of Search ............... 364/480, 481, 514, 550, 364/570, 571, 573, 607, 608, 579; 358/10, 21 R, 139

[56] References Cited

U.S. PATENT DOCUMENTS

| | | | |
|---|---|---|---|
| 4,204,228 | 5/1980 | Mason et al. | 358/139 |
| 4,322,749 | 3/1982 | Weston | 358/139 |
| 4,534,059 | 8/1985 | Yamada | 364/571 |
| 4,635,096 | 1/1987 | Morgan | 358/10 |

OTHER PUBLICATIONS

Wittman et al., IEEE Transactions on Acoustics, Speech, and Signal Processing, "A Hardward Multitone Digital Frequency Synthesizer", vol. ASSP-27, No. 6, Dec. 1979, pp. 804–809.

Primary Examiner—Felix D. Gruber
Assistant Examiner—Brian M. Mattson
Attorney, Agent, or Firm—Bruce D. Riter; Theodore S. Park; Charles E. Krueger

[57] ABSTRACT

A digital test system for generating a test signal in the form of an amplitude and/or phase modulated sinusoidal signal at a given carrier frequency is disclosed. Arbitrary amplitude and phase modulation functions may be selected and are provided to the system in the form of digitally encoded data streams. The system does not require a digital multiplier. A signal in the form of an unmodulated carrier signal may also be generated.

5 Claims, 1 Drawing Figure

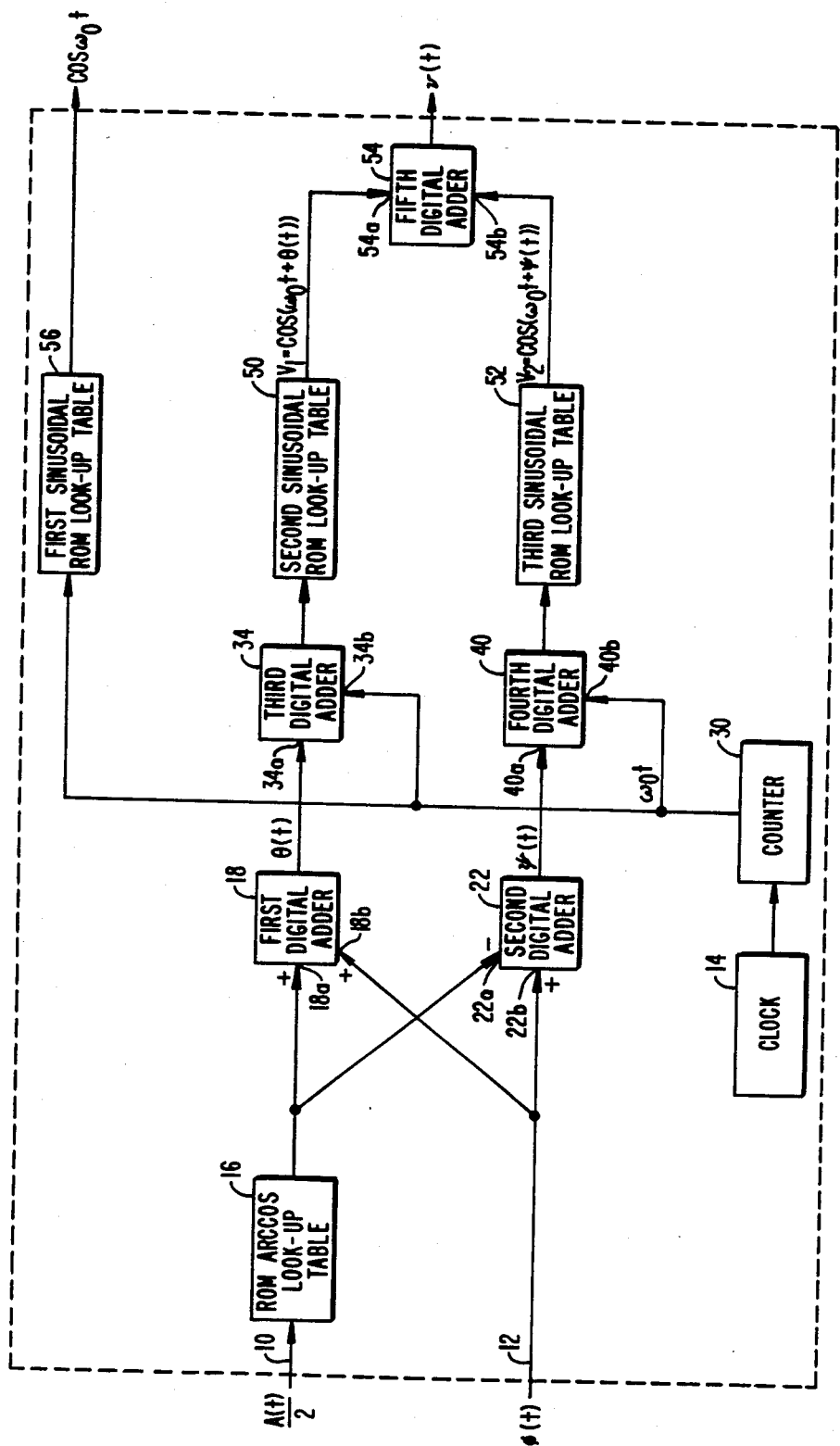
FIG._1.

DIGITAL METHOD FOR SYNTHESIZING COMPOSITE VIDEO SIGNALS

BACKGROUND OF THE INVENTION

The present invention relates generally to electronic test systems and more particular to systems for testing video components.

There is a growing need in the video electronics industry for test systems capable of providing a simulated color television video test signal. The luminous information of a color video signal represents shades of black and white, while the chrominance is represented by a color burst signal that establishes a phase reference together with a suppressed carrier quadrature modulation signal. The amplitude and phase of the suppressed signal deifnes a unique point and, hence, the color on a chromaticity diagram Consistent, reliable, maintenance-free, analog instrumentation capable of producing a signal of this complexity is difficult to design and produce. An analog system requires balanced modulators that are inherently unstable. Additionally, subcarrier feed through and the need for critical phase stability and control are problems inherent in an analog implementation of a video tst system.

The video electronics industry is experiencing a trend toward the use of digital video systems and components. These systems require a test system capable of generating digitized test signals. One factor limiting the use of digital testing systems is the expense of including digital multipliers in the system.

SUMMARY OF THE INVENTION

The present invention is a system and method for generating a first digital signal that is a fixed amplitude sinusoidal signal at a given carrier frequency and a second digital signal that is a sinusoidal signal at the same given carrier frequency having time-varying amplitude and phase. These signals may be utilized to represent an arbitrary color television chroma test pattern, with the amplitude and phase representing polar coordinates encoding the magnitude and phase of the chrominance signal.

In one embodiment of the invention, two digital data streams, representing the amplitude, A(t), and phase, $\phi(t)$, of an arbitrary color television test pattern are accepted at a pair of input ports. An arccosine ROM look-up table is utilized to convert the amplitude digital data stream into a digital data stream representing the arc-cosine function of one-half the amplitude. A pair of digital adders is then utilized to generate digital data streams representing the sum and difference of the arc-cosine digital data stream and the phase digital data stream.

The outputof a digital counter is utilized to represent a constant frequency, linear phase digital data stream increasing linearly in time modulo N. the linear phase function is utilized to address a sinusoidal ROM look-up table with the output of the first sine ROM look-up table being the output signal corresponding to a sinusoidal function having a fixed carrier frequency.

The outputs from the first pair of digital adders are routed to corresponding inputs of a second pair of digital adders while the linear phase digital data stream is directed to a second input of each digital adder. The outputs from each one of the second pair of digital adders are utilized to address corresponding sinusoidal ROM look-up tables. The outputs from these sinusoidal ROM look-up tables are input to a fifth digital adder with the output of the fifth digital adder representing the second digital sinusoidal signal at the same given frequency as the first signal and having a time varying amplitude equal to $A(t_n)$ and a time-varying phase equal to $\phi(t_n)$.

The present invention provides for the generation of a complex digital sinusoidal signal having an arbitrary time varying amplitude and phase. The system utilizes only ROM look-up tables and digital adders, which are low cost components. The system is adapted for use with digital video systems and components and requires no analog to digital or digital to analog conversion. However, digital to analog converters could be used at the outputs for generating analog equivalent signals.

BRIEF DESCRIPTION OF THE DRAWING

FIG. 1 is a schematic diagram of an embodiment of the present invention.

DESCRIPTION OF THE PREFERRED EMBODIMENT

The system generates a digital test signal of the form:

$$V(t_n) = A(t_n) \cdot \cos(\Phi_o t_n + \phi(t_n)) \quad (1)$$

where $t_n$ represents the time at which the nth clock pulse of a system clock is generated. In general $$t_n = t_o + nt_c$$

where $t_o$ is some arbitrary starting time, $t_c$ is the clock interval, and n is an integer.

The amplitude $A(t_n)$, and phase $\phi(t_n)$, elements are specified as arbitrary input digital data streams externally supplied to the system of the invention. These digital data streams may represent the time-varying amplitude and phase function of a color television test pattern. The system of the present invention processes these input digital data streams to produce a signal in the form of Equation 1. Additionally, a phase reference signal in the form of:

$$\cos(\omega_o t_n) \quad (2)$$

is provided by the system, where $\omega_o$ is a given carrier frequency.

FIG. 1 is a schematic diagram of the invention. The system receives, at a test system input 10, a first digital data stream, $A(t_n)/2$, having elements representing one-half the time-varying amplitude of a preselected color video test signal. Each amplitude value in the digital data stream may be represented by an m digit binary number. Similarly, a second digital data stream, $\phi(t_n)$, representing the time-varying phase of the color video test pattern is received at a second system input 12. All operations of the system are synchronized by a clock signal from a system clock 14.

The amplitude values in the first digital data stream are utilized to address an arc-cosine ROM look-up table 16 that has stored at each address corresponding to the value of elements, $A(t_n)$, the value arc-cosine of $A(t_n)/2$. The output from the arc-cosine ROM look-up table 16 is routed to a first addition input 18a of a first digital adder 18 and to a subtraction input 22a of a second digital adder 22. The input signal from the second input 12, corresponding to $\phi(t_n)$, is routed to a second plus input 18b of the first digital adder 18 and a first plus input 22b of the second digital adder 22. The output of the first digital adder 18 is given by the following equation:

$$\theta(t_n) = \phi(t_n) + \cos^{-1}(A(t_n)/2) \quad (3)$$

and the output of the second digital adder 22 is given by the equation:

$$\psi(t_n) = \phi(t_n) - \cos^{-1}(A(t_n)/2) \quad (4)$$

A counter 30 is used to generate a linear ramp representing the term $\omega_o t_n$. The output from the first digital adder 18 is routed to a first addition input 34a of a third digital adder 34 while the output of the counter 30 is routed to a second addition input 34b of the third digital adder 34. Thus, the output of the third digital adder is equal to:

$$\omega_o t_n + \theta(t_n) \quad (5)$$

Similarly, the output from the second digital adder 22 is routed to a first input 40a of a fourth digital adder 40 while the output of the counter 30 is routed to a second addition input 40b of the fourth digital adder 40. Thus, the output of the fourth digital adder is equal to:

$$\omega_o t_n + \psi(t_n) \quad (6)$$

The output signals from the third and fourth digital adders 34 and 40 are utilized to address second and third sinusoidal ROM look-up tables 50 and 52 that have stored at each address corresponding to the value of the input element a value equal to the cosine of the input element. Thus the output ($V_1$) of the secnd ROM look-up table 50 is given by:

$$V_1 = \cos(\omega_o t_n + \theta(t_n)) \quad (7)$$

and the output ($V_2$) of the third ROM look-up table 52 is given by:

$$V_2 = \cos(\omega_o t_n + \psi(t_n)) \quad (8)$$

These output signals from the second and third ROM look-up tables 50 and 52 are routed to the addition inputs 54a and 54b of a fifth digital adder 54 with the output signal from the fifth digital adder 54 being equal to:

$$v(t) = \cos(\omega_o t_n + \theta(t_n)) + \cos(\omega_o t_n + \psi(t_n)) \quad (9)$$

If the interval 0 to $2\pi$ is mapped on to the binary interval 0 to $2^m$, then the values of the arguments and the cosine functions of equation (9) may be expressed as binary numbers modulo $2^m$. Retaining the m least significant bits of the outputs from the third and fourth digital adders 34 and 40 will result in the sums $(\omega_o t_n + \theta(t_n))$ and $(\omega_o t_n + \psi(t_n))$ modulo $2^m$.

The output signal, modulo $2^m$, from the counter 30 is utilized to address the first sinusoidal ROM look-up table 56 to provide a reference carrier output signal equal to $\cos(\omega_o t_n)$.

Substituting the values of $\theta(t_n)$ and $\omega(t_n)$ from equations (5) and (6) into the expression of equation (9) and using the following trigonometric identity:

$$2\cos\alpha\cos\beta = \cos(\alpha+\beta) + \cos(\alpha-\beta) \quad (11)$$

shows that v(t) is in the form of equation (1), which is the desired form.

The present invention is a generalized modulation synthesizer suitable to many testing applications. For example, the present system may be utilized to generate modulated signals having either angle or amplitude modulation. The system provides a first output in the form of a reference sinusoidal carrier having a given carrier frequency, $\omega_o$, and a second signal for establishing an amplitude and/or phase modulated sinusoidal signal at the given carrier frequency. The system outputs may be passed through digital to analog converters and low pass filters to generate analog signals for testing analog systems. These signals will generally be more stable than signals produced by an analog tester. Additionally, analog input signals may be converted to digital data streams by utilizing an analog to digital converter driven by the system clock, before being directed to the system inputs 10 and 12.

A further advantage of the invention is the capability of providing either angle only modulation (FM and phase) or amplitude only modulation (AM).

Amplitude only modulation is achieved by setting the data elements in the second bit stream, $\phi$, equal to zero or a constant and varying the elements in the first bit stream, A, according to the desired AM function.

Similarly, FM or phase only modulation is achieved by setting the $A_n$s equal to a constant and varying the $\phi_n$s according to the desired modulation function.

The foregoing is a detailed description of a preferred embodiment of the invention. Although specific circuit elements and system components have been described to illustrate and explain the invention, these details should not be interpreted as limiting the invention. In particular, the sinusoidal ROM look-up table may be replaced by any digital component that accepts an input element from an input digital data stream and generates an output element having a value equal to the cosine of an angle that is proportional to the value of the input element.

Additionally, in the embodiment described, a digital data stream with elements equal to $A(t_n)/2$ is provided to the input of the arc-cosine ROM look-up table 16. Alternatively, the arc-cosine ROM look-up table could be programmed to accept elements equal to $A(t_n)$ and provide elements equal to $\cos^{-1}(A(t_n)/2)$ at its output.

Accordingly, the present invention is not intended to be limited except as defined by the appended claims.

What is claimed is:

1. A system for generating a test signal, the system of the type that receives first and second input digital data signals $A(t_n)/2$ and $\phi(t_n)$, said system comprising:

a first system input port for accepting said first input digital data signal;

a second system input port for accepting said second input digital data signal;

an arc cosine ROM look-up table having an input port connected to said first system input port for accepting said first input digital data signal, for utilizing said first input digital data signal to address a storage location with the value $\cos^{-1}(A(t_n)/2)$ stored therein, and for transferring the value $\cos^{-1}(A(t_n)/2)$ to an output port to form an output digital data signal equal to $\cos^{-1}(A(t_n)/2)$;

a first digital adder, with a first addition input port connected to the output port of said arc cosine ROM look-up table and with a second addition input port connected to said second system input port, for generating a sum of the signals at its first and second addition input ports, and for transferring a digital output signal to an output port with said signal equal to $\theta(t_n) = \phi(t_n) + \cos^{-1}(A(t_n)/2)$;

a second digital adder having a first subtraction input port connected to the output port of said arc cosine ROM look-up table and a second addition input port connected to said second system input port for forming the difference of the signals at its first and second input ports, and for transferring a digital output signal to an output port, with said signal equal to $\psi(t_n) = \phi(t_n) - \cos^{-1}(A(t_n)/2)$;

a digital counter for providing a digital linear ramp signal, having elements proportional to $\omega_0 t_n$, at an output port;

a third digital adder having a first addition input connected to the output port of said first digital adder and a second addition input connected to the output port of said digital counter for forming a sum of the signals at its first and second addition input ports, and for transferring a digital output signal to an output port, with said signal equal to $\omega_0 t_n + \theta(t_n)$;

a fourth digital adder having a first addition input port conected to the output port of said second digital adder and a second addition input port connected to the output port of said digital counter, for forming a sum of the signals at said first and second addition input ports, and for transferring a digital output signal to an output port, with said signal equal to $\omega_0 t_n + \psi(t_n)$;

a first sinusoidal ROM look-up table having its input port connected to the output port of said third digital adder, for accepting the digital output signal from said third digital adder at an input port, and for utilizing said output signal to address a storage location with the value $\cos(\omega_0 t_n + \theta(t_n))$ stored therein, and for transferring the value $\cos(\omega_0 t_n + \theta(t_n))$ to an output to form an output digital data signal equal to $\cos(\omega_0 t_n + \theta(t_n))$;

a second sinusoidal ROM look-up table having its input port connected to the output port of said fourthe digital adder, for accepting the digital output signal from said fourth digital adder at an input port, and for utilizing said output signal to address a storage element location with the value $\cos(\omega_0 + \psi(t_n))$ and for transferring the value $\cos(\omega_0 t_n + \psi(t_n))$ to an output port to form an output digital data signal equal to $\cos(\omega_0 t_n + \psi(t_n))$; and a fifth digital adder with a first addition input connected to the output port of said first sinusoidal ROM look-up table and having a second input addition port connected to the output port of said second sinusoidal ROM look-up table, for generating an output signal equal to $V(t_n) = A(t_n) \cdot \cos(\omega_0 t_n + \phi(t_n))$.

2. A method for generating a video test signal comprising the steps of:

providing a digital amplitude signal $A(t_n)/2$;
providing a first digital phase signal $\phi(t_n)$;
digitally performing an inverse sinusoidal transformation on said digital amplitude signal to generate an inverse sinusoidal digital signal, inv sinusoid $(A(t_n)/2)$;
digitally adding said digital inv sinusoid signal and said first digital phase signal to generate a third digital phase signal $\theta(t_n)$;

subtracting one of said digital inv sinusoid and first digital phase signals from the other of said digital inv sinusoid and first digital phase signals to generate a second digital phase signal $\psi(t_n)$;
generating a digital linear phase signal $\omega_0 t_n$;
adding said digital linear phase signal and said second digital phase signal to generate a first digital argument signal;
adding said digital linear phase signal to said third digital phase signal to generate a second digital argument signal;
digitally performing a sinusoidal transformation of said first digital argument signal to generate a first digital sinusoid signal;
digitally performing a sinusoidal transformation of said second digital argument signal to generate a second digital sinusoid signal; and
digitally combining said first and second digital sinusoid signals to generate the video test signal.

3. The invention of claim 2 wherein said step of digitally performing an inverse sinusoidal transformation comprises the step of:
performing an arc cos transformation; and
wherein said step of digitally combining comprises the step of:
adding said first and second digital sinusoid signals.

4. A method for digitally generating a video test signal of the form $$V(t_n) = A(t_n) \cos(\omega_0 t_n + \phi(t_n))$$

comprising the steps of:
providing a digital amplitude signal $A(t_n)/2$;
providing a first digital phase element $\phi(t_n)$;
generating an arc cos digital element having a value of arc cos $A(t_n)/2$;
digitally adding said arc cos digital element to said first digital phase element to generate a second digital phase element $\theta(t_n)$;
digitally subtracting said arc cos digital element from said first digital phase element to generate a third digital phase element $\psi(t_n)$;
generating a clock signal including a series of clock pulses;
digitally counting said clock signals to generate a digital linear phase element $\omega_0 t_n$,
digitally adding said second digital phase element to said digital linear phase element to form a first digital argument element $(\omega_0 t_n + \theta(t_n)$;
digitally adding said third digital phase element to said digital linear phase element to form a second digital argument element $(\omega_0 t_n + \psi(t_n))$;
generating a first digital cos element having a value of $\cos(\omega_0 t_n + \theta(t_n))$;
generating a second digital cos element having a value of $\cos(\omega_0 t_n + \psi(t_n))$; smf
digitally adding said first and second digital cos elements to generate a digital video signal data element $V(t_n)$.

5. A system for generating a digital test signal that receives first and second input digital data signals $A(t_n)/2$ and $\phi(t_n)$, said system comprising:
a first system input port for accepting said first input digital data signal;
a second system input port for accepting said second input digital data signal;
an inverse sinusoidal transformation ROM look-up table having an input port connected to said first system input port for accepting said first input digital data signal, for utilizing said first input digital data signal to address a storage location with the value inv sinusoid ($A(t_n)/2$) stored therein, and for transferring the value inv sinusoid ($A(t_n)/2$) to an output port to form an output digital data signal equal to inv sinusoid ($A(t_n)/2$);

a first digital adder, with a first addition input port connected to the output port of said inverse sinusoidal transformation ROM look-up table and with a second addition input port connected to said second system input port, for generating first digital phase signal equal to a sum of the signals at its first and second addition input ports, and for transferring said first digital phase signal to an output port;

a digital subtracter having a first input port connected to the output of said inverse sinusoidal transformation ROM look-up table and a second input port connected to said second system input port for generating a second digital phase signal equal to a difference of the signals at its first and second input ports, and for transferring said second digital phase signal to an output port;

a digital counter for providing a digital linear ramp signal equal to $\omega_0 t_n$ at an output port;

a third digital adder having a first addition input port connected to the output port of said first digital adder and a second addition input connected to the output of said digital counter for generating a first digital argument signal equal to a sum of the signals at its first and second addition input ports, and for transferring said first digital argument signal to an output port;

a fourth digital adder having a first addition input port connected to the output port of said digital subtractor and a second addition input connected to the output of said digital counter, for generating a second digital argument signal equal to a sum of the signals at its first and second addition input ports, and for transferring said second digital argument signal to an output port;

a first sinusoidal ROM lookup table having its input connected to the output port of said third digital adder, for accepting the digital output signal from said third digital adder at an input port, and for utilizing this output signal to address a storage location with the value sinusoid ($\omega_0 t_n + \theta(t_n)$) stored therein, and for transferring the value sinusoid ($\omega_0 t_n + \theta(t_n)$) to an output port to generate a first digital sinusoid data signal;

a second sinusoidal ROM look-up table having its input port connected to the output port of said fourth digital adder, for accepting the digital output signal from said fourthe digital adder at an input port, and for utilizing this output signal to address a storage element location with the value sinusoid ($\omega_0 t_n + \psi(t_n)$) stored therein, and for transferring the value sinusoid ($\omega_0 t_n + \psi(t_n)$) to an output port to generate a second sinusoid; and a digital combiner with a first input port connected to the output port of said first sinusoidal ROM lookup table and having a second input port connected to the output port of said second sinusoidal ROM look-up table, for combining said first and second digital sinusoidal data signals to generate a digital test signal equal to $V(t_n) = A(t_n) \cdot \text{sinusoid}(\omega_0 t_n + \phi(t_n))$.

* * * * *